(12) United States Patent
Song et al.

(10) Patent No.: US 7,679,165 B2
(45) Date of Patent: Mar. 16, 2010

(54) HIGH BRIGHTNESS LIGHT EMITTING DIODE WITH A BIDIRECTIONALLY ANGLED SUBSTRATE

(75) Inventors: Joon-Suk Song, Gyeonggi-do (KR); Soo-Hyung Seo, Gyeonggi-do (KR); Myung-Hwan Oh, Gyeonggi-do (KR)

(73) Assignee: NeosemiTech Corporation, Seoul (KR)

( * ) Notice: Subject to any disclaimer, the term of this patent is extended or adjusted under 35 U.S.C. 154(b) by 0 days.

(21) Appl. No.: 12/381,238

(22) Filed: Mar. 10, 2009

(65) Prior Publication Data
US 2009/0218562 A1 Sep. 3, 2009

Related U.S. Application Data

(62) Division of application No. 11/359,798, filed on Feb. 22, 2006, now Pat. No. 7,524,708.

(30) Foreign Application Priority Data
Feb. 28, 2005 (KR) .............. 10-2005-0016770
Dec. 1, 2005 (KR) .............. 10-2005-0116268

(51) Int. Cl.
| H01L 27/15 | (2006.01) |
| H01L 29/26 | (2006.01) |
| H01L 31/12 | (2006.01) |
| H01L 33/00 | (2006.01) |
| H01L 29/06 | (2006.01) |
| H01L 29/04 | (2006.01) |
| H01L 21/00 | (2006.01) |

(52) U.S. Cl. .............. 257/628; 257/79; 257/98; 257/627; 257/E33.003; 438/29
(58) Field of Classification Search ............ 257/79, 257/98, 627, 628, E33.003; 438/29
See application file for complete search history.

(56) References Cited
U.S. PATENT DOCUMENTS

| 5,843,227 A | * | 12/1998 | Kimura et al. | .............. 117/101 |
| 2002/0080835 A1 | * | 6/2002 | Mitomo et al. | ............ 372/45 |
| 2003/0155335 A1 | * | 8/2003 | Ohmi et al. | ............ 219/121.72 |
| 2004/0233957 A1 | * | 11/2004 | Ito et al. | ............ 372/46 |
| 2005/0145857 A1 | * | 7/2005 | Maruyama et al. | ........... 257/79 |

* cited by examiner

*Primary Examiner*—Phat X Cao
*Assistant Examiner*—Diana C Garrity
(74) *Attorney, Agent, or Firm*—Chapman and Cutler LLP

(57) ABSTRACT

A light emitting diode includes a substrate tilted toward first and second directions simultaneously, a first cladding layer formed with a semiconductor material of a first conductive type on the substrate, an active layer formed on the first cladding layer, and a second cladding layer formed with a semiconductor material of a second conductive type on the active layer, wherein concavo-convexes are formed on the interfaces of the first cladding layer, the second cladding layer, and the active layer, and the (100) substrate is a III-V or a IV-IV group semiconductor substrate, and has a crystal orientation such that a (100) plane of the (100) substrate is inclined 2 to 20° toward the [0-1-1] direction and 1 to 8° toward the [0-11] direction.

4 Claims, 9 Drawing Sheets

HIGH BRIGHTNESS LIGHT EMITTING DIODE WITH A BIDIRECTIONALLY ANGLED SUBSTRATE

CROSS REFERENCE TO RELATED APPLICATIONS

This is a division of U.S. patent application Ser. No. 11/359,798, filed on Feb. 22, 2006. This application claims priority to and the benefit of Korean Patent Applications Nos. 10-2005-0016770 and 10-2005-0116268 filed respectively on Feb. 28 and Dec. 2, 2005 in the Korean Intellectual Property Office, the contents of which are incorporated herein by reference.

BACKGROUND OF THE INVENTION (a) Field of the Invention

The present invention is related to a light emitting diode and a fabrication method thereof, and in particular, to a light emitting diode fabricated by growing single crystal thin films through controlling the crystal orientation of the substrate.

(b) Description of the Related Art

A light emitting diode is a photoelectric conversion element having a structure such that an n-type semiconductor which has electrons as a carrier and a p-type semiconductor which has holes as a carrier are welded to each other.

In order to convert electrical energy into light, a voltage is set up on both electrode terminals of the light emitting diode, and a current is applied in one direction. The electrons and the holes recombine and a part of the energy generated by the recombination is converted into light.

The light emitting diode is used for a display when the wavelength of the light emitted from the light emitting diode is in the visible region, it is used for various excitation light sources when the wavelength is in the ultraviolet region, and it is used as an element that transfers information between machines when the wavelength is in the infrared region.

The performance of a light emitting diode that emits visible light is determined by light emitting efficiency (luminous efficiency), and the light emitting efficiency is indicated as lumens per watt.

The light emitting efficiency of the light emitting diode is mainly dependent on the three factors of internal quantum efficiency, extraction efficiency, and operating voltage.

The internal quantum efficiency is a characteristic value of the amount of photons for the amount of electrons passing through the light emitting diode, and it is determined by the quality of the semiconductor material and the design of the active portion.

The extraction efficiency is a ratio of the amount of photons extracted from the semiconductor chip to the amount of photons generated in this way.

Many deflections of the photons occur due to a large difference of the refractive index between the semiconductor and the other material, and some of the photons are absorbed by the semiconductor chip during the deflection. Accordingly, the extraction efficiency is limited by the deflection of the photons in the semiconductor chip.

The external quantum efficiency is a product of the internal quantum efficiency and the extraction efficiency.

Recently, InGaAlP and InGaN light emitting diodes that were grown with metal organic chemical vapor deposition have been developed. InGaAlP is a III-V group compound semiconductor of direct transition that can be matched to a GaAs substrate and that has high internal quantum efficiency.

In spite of the development of technologies, the efficiency of extraction of photons that can be extracted from the inside to the outside of the light emitting diode, that is, the extraction efficiency, has a fundamental limitation due to the internal loss and the large refractive index of the light emitting diode.

Methods for improving light extraction efficiency are under constant development. As one of these efforts, a method of forming concavo-convexes on the substrate is known.

The concavo-convexes are formed on the substrate through a photolithography and dry etching technique, and single crystal thin films are grown on the substrate which the concavo-convexes are formed on.

A diffused reflection of light emitted from the active layer occurs due to the concavo-convexes formed on the interfaces of the single crystal thin films so that the light emitting efficiency is improved.

However, the process of forming the concavo-convexes on the substrate is very complex because of the photolithography and dry etching technique. In addition, it is difficult to grow the single crystal thin films on a plane that has the concavo-convexes, and the cost of fabricating the light emitting diode is too high.

SUMMARY OF THE INVENTION

It is an object of present invention to provide a light emitting diode that has high emitting efficiency, and in particular that has high extraction efficiency, and a fabrication method of the same.

This object may be achieved by a light emitting diode and a fabrication method of the same with the following features.

The light emitting diode includes a substrate having a crystal orientation such that a plane of the substrate is tilted toward a first and a second direction simultaneously, a first cladding layer is formed with a semiconductor material of a first conductive type on the substrate, an active layer is formed on the first cladding layer, and a second cladding layer is formed with a semiconductor material of a second conductive type on the active layer, wherein concavo-convexes are formed on the interfaces of the first cladding layer, the second cladding layer, and the active layer.

In this case, the substrate may be a III-V or a IV-IV group semiconductor material.

The substrate may be a (100) III-V group semiconductor substrate having a crystal orientation such that a (100) plane of the substrate is tilted toward [0-1-1] and [0-11] directions simultaneously.

The substrate may have a crystal orientation such that the (100) plane may be tilted as 2 to 20° toward the [0-1-1] direction and 1 to 8° toward the [0-11] direction.

The substrate may be a GaAs substrate, the first and second cladding layers may be formed with InGaAlP single crystal thin films, and the active layer includes an InGaP quantum well and an InGaAlP quantum barrier.

The substrate may be an InP substrate, and the first and second cladding layers and the active layer may be formed with InGaAsP single crystal thin films.

The substrate may be a SiC substrate.

The fabrication method of a light emitting diode includes steps of preparing a substrate that is tilted toward a first direction and a second direction simultaneously, forming a first cladding layer with a semiconductor material of a first conducive type on the substrate, forming an active layer on the first cladding layer, and forming a second cladding layer with a semiconductor material of a second conducive type on the active layer.

The steps of forming the first cladding layer, the second cladding layer, and the active layer may be performed with metal-organic chemical vapor deposition or molecular beam epitaxy, or with the mixed method of both the metal-organic chemical vapor deposition and the molecular beam epitaxy.

DETAILED DESCRIPTION OF THE PREFERRED EMBODIMENTS

The present invention will be described more fully hereinafter with reference to the accompanying drawings, in which preferred embodiments of the invention are shown.

Figure 1:
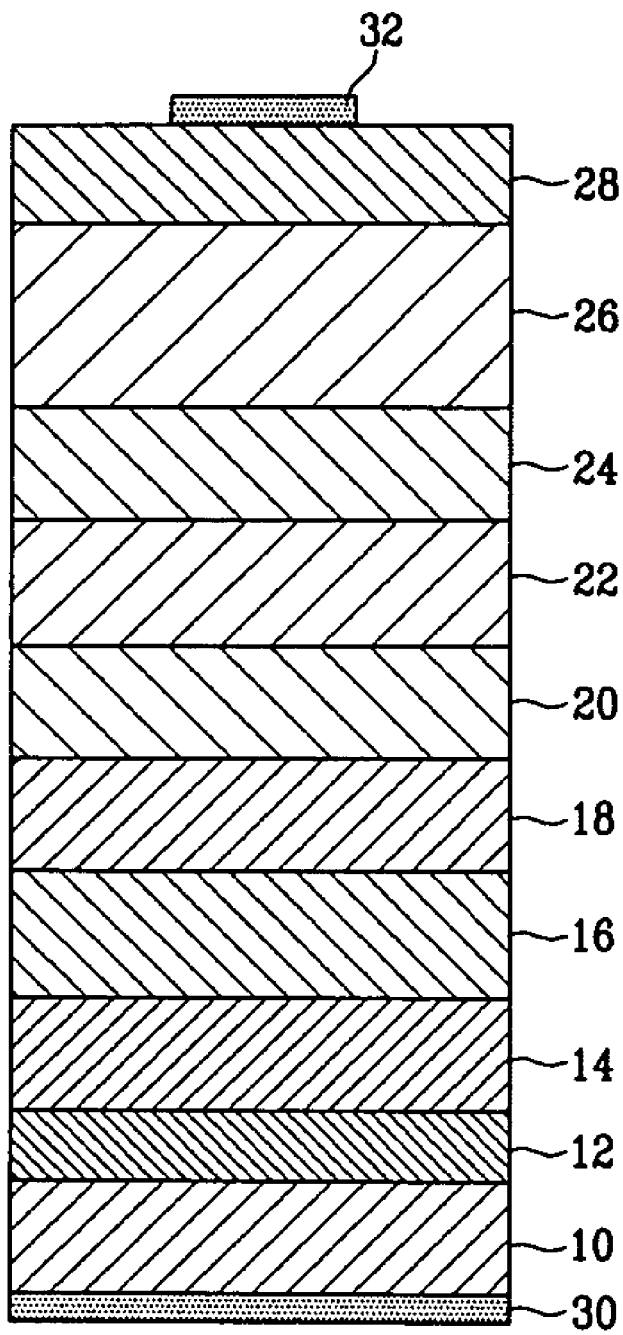
FIG. 1 is a sectional schematic view of the light emitting diode according to the exemplary embodiment of the present invention.

FIG. 1 is a sectional view showing the structure of a light emitting diode according to an exemplary embodiment of the present invention.

As shown in the drawing, the light emitting diode includes a substrate 10 having a predetermined crystallographic orientation, a first buffer layer 12 formed on the substrate 10, a first cladding layer 14 formed on the first buffer layer 12, a first confining layer 16 formed on the first cladding layer 14, an active layer 18 formed on the first confining layer 16, a second confining layer 20 formed on the active layer 18, a second buffer layer 22 formed on the second confining layer 20, a second cladding layer 24 formed on the second buffer layer 22, a window layer 26 formed on the second cladding layer 24, and a cap layer 28 formed on the window layer 26.

The first buffer layer 12, the first cladding layer 14, and the first confining layer 16 are formed with a semiconductor material of a first conductive type, and the second cladding layer 24, the window layer 26, and the cap layer 28 are formed with a semiconductor material of a second conducive type.

In addition, a first electrode 30 of the first conducive type is arranged beneath the substrate 10, and a second electrode 32 of the second conducive type is arranged on the cap layer 28.

The light emitting diode according to the exemplary embodiment is an InGaAlP light emitting diode.

In this case, the substrate 10 may be a (100) GaAs substrate, the first buffer layer 12, the first cladding layer 14 and the first confining layer 16 may be formed with n-type InGaAlP, and the active layer 18 may include quantum wells (QW) formed with GaInP and quantum barriers (QB) formed with InGaAlP.

The second confining layer 20 and the second buffer layer 22 may be formed with n-type InGaAlP, the second cladding layer 24 may be formed with p-type InGaAlP, the window layer 26 may be formed with p-type InGaAlP or p-type GaP, and the cap layer 28 may be formed with p-type GaAs.

Meanwhile, the first electrode 30 may be formed with n-type Au/AuGeNi or Au/AuGe, and the second electrode 32 may be formed with p-type Au/AuBe or Au/AuZn.

The light emitting diode according to another exemplary embodiment of the present invention may be an InP light emitting diode. In this case, the substrate may be an InP substrate, and the first cladding layer, the second cladding layer, and the active layer may be formed with InGaAsP.

However, the present invention may be adapted to other light emitting diodes in addition to the InGaAlP and InP light emitting diodes described above. In these cases, semiconductor substrates such as III-V and IV-IV group substrates including a SiC substrate can be used.

Figure 2:
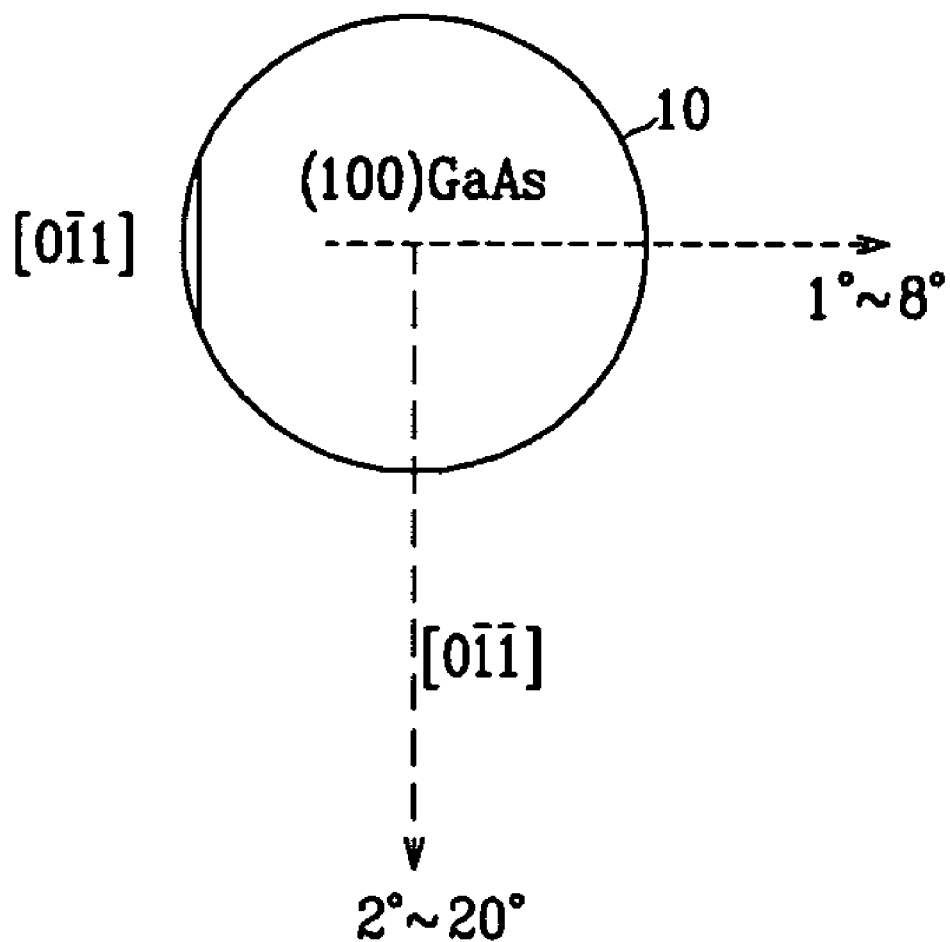
FIG. 2 is a schematic view showing the crystal orientation of the fabrication method of the light emitting diode according to the exemplary embodiment of the present invention.

FIG. 2 is a schematic view showing a crystal orientation of the substrate 10. The substrate 10 has a crystal orientation such that a plane of the substrate is tilted toward a first direction and a second direction simultaneously.

As shown in the drawing, the substrate 10 is a (100) GaAs substrate, and the substrate 10 has a crystal orientation such that the (100) plane of the substrate is tilted as 2 to 20° toward the [0-1-1] direction and 1 to 8° toward the [0-11] direction.

If single crystal thin films are grown on the substrate 10 having such crystallographic orientation, concavo-convexes are formed on the interfaces between the single crystal thin films and the substrates. Consequently, the extraction efficiency of the light emitting diode is improved by the diffused reflection of the light emitted from the active layer 18.

A fabrication method of the light emitting diode will be described hereinafter.

As described above, the substrate 10 of the light emitting diode according to the exemplary embodiment has a crystal orientation such that the (100) plane of the substrate is tilted as 2 to 20° toward the [0-1-1] direction and 1 to 8° toward the [0-11] direction.

Tilting the (100) GaAs substrate 10 toward the [0-1-1] direction is for preventing degradation of the single crystal thin films grown on the (100) GaAs substrate 10 due to the ordering.

However, in the case that the substrate 10 is tilted as less than 2° toward the [0-1-1] direction, the effect of preventing the ordering is small. Accordingly the (100) plane of the substrate 10 is tilted as 2° or more toward the [0-1-1] direction.

In addition, in the case that the substrate 10 is tilted as more than 20° toward the [0-1-1] direction, the crystal orientation of the substrate 10 becomes different from that of the (100) plane. Accordingly the (100) plane of the substrate 10 is tilted as 20° or less.

In this way, if the single crystal thin films are grown on the substrate 10 in the state that the (100) plane of the substrate 10 is tilted as 2 to 20° toward the [0-1-1] direction and then is tilted toward the [0-11] direction again, Ga and As atoms are exposed simultaneously on the surface of the substrate 10. Accordingly, the interfaces of the single crystal thin films become rough.

Therefore, the concavo-convexes do not exist in the substrate 10 itself. However, the concavo-convexes are generated on the interfaces of the single crystal thin films formed on the substrate 10, so the light emitting efficiency is enhanced.

The process with which the concavo-convexes are generated on the interfaces of the single crystal thin films will be described more fully hereinafter.

Figure 3A:
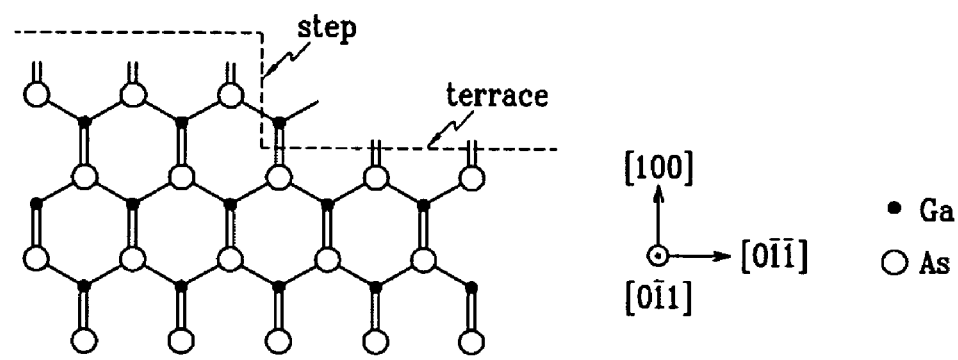
FIGS. 3A and 3B are schematic views showing the different surface step of the (100) GaAs substrate.
Figure 3B:
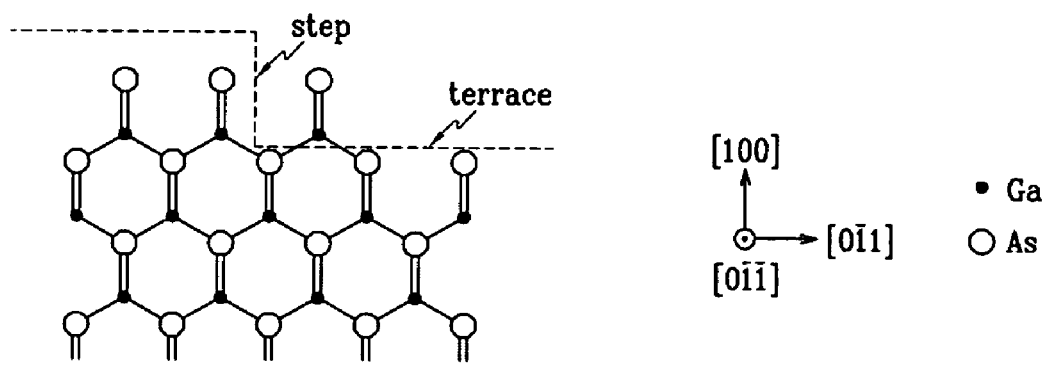

FIG. 3a shows a surface step of the (100) GaAs substrate in the case that the (100) GaAs substrate is cut while being tilted toward the [0-1-1] direction, and FIG. 3b shows a surface step of the (100) GaAs substrate in the case that the (100) GaAs substrate is cut while being tilted toward the [0-11] direction.

As shown in FIG. 3a, when the substrate is cut while being tilted toward the [0-1-1] direction, the Ga atoms are exposed on the step. The tilted plane of the substrate has similar properties to that of a (111)A plane.

Meanwhile, as shown in FIG. 3b, when the substrate is cut while being tilted toward the [0-11] direction, the As atoms are exposed on the step. The tilted plane of the substrate has properties similar to that of a (111)B plane.

Therefore, in this way, according to the tilting direction of the substrate, the optimal growth condition of the single crystal thin films is changed.

In the case that the substrate is tilted toward the [0-1-1] direction and the [0-11] direction simultaneously as in the exemplary embodiment, the Ga and As atoms are exposed on the surface of the substrate at the same time. It therefore deviates from the optimum crystal growth condition, and accordingly the interfaces of the single crystal thin films become rough as they grow.

In this way, the concavo-convexes are generated on the interfaces of the single crystal thin film during the growth of the single crystal thin film without an additional process when selectively controlling the crystal orientation of the substrate.

Figure 4:
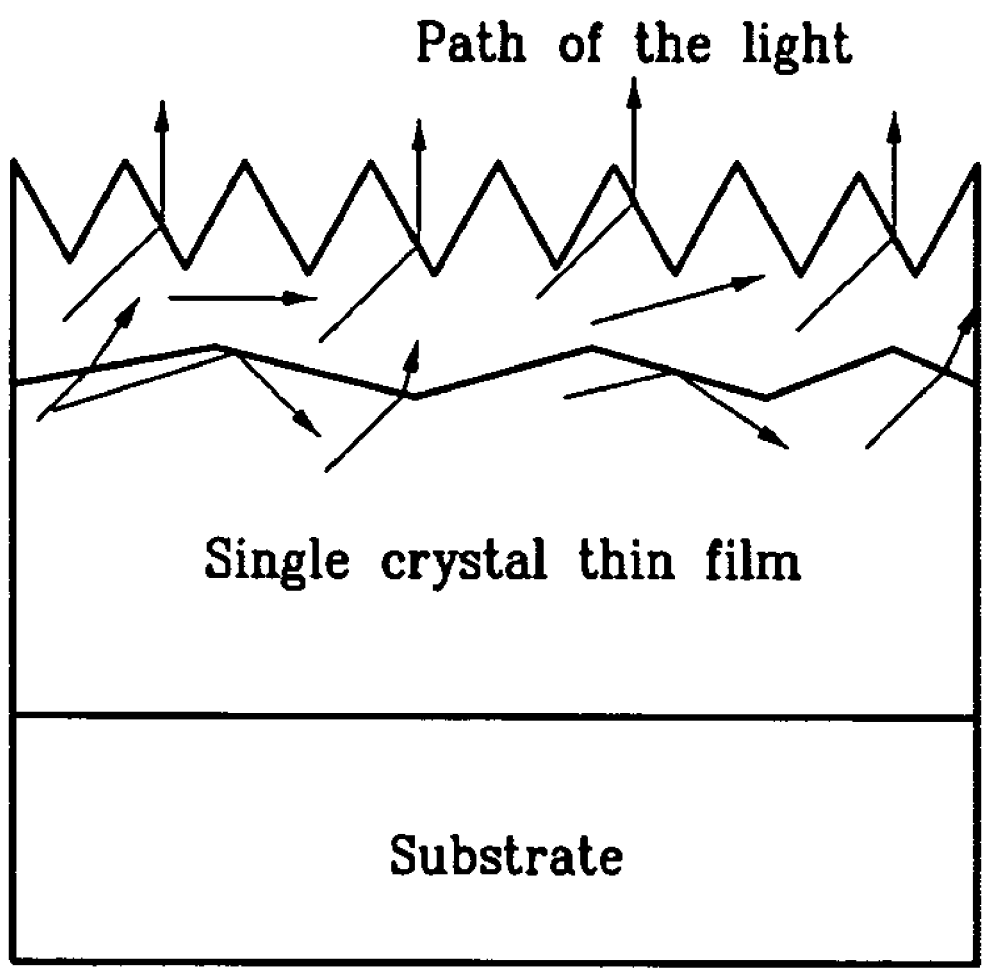
FIG. 4 is a schematic view showing the diffused reflection of the light by single crystal thin films.

FIG. 4 schematically shows the diffused reflection of the light in the single crystal thin films grown through the process described above.

When the substrate 10 is tilted as less than 1° toward the [0-11] direction, the effect of generating the concavo-convexes on the interfaces of the single crystal thin films is small. Accordingly the (100) plane of the substrate 10 is tilted as 1° or more toward the [0-11] direction.

However, when the substrate 10 is tilted as more than 8° toward the [0-11] direction, the ordering effect becomes serious. Accordingly, the (100) plane of the substrate 10 is tilted as 1 to 8°.

The present invention will be described more fully hereinafter with experimental examples. However, the experimental examples are merely for exemplifying the present invention, and the present invention is not restricted thereto.

Experimental Examples

InGaP thin films with a 4000 Å thickness were grown on each of 4 inch (100) GaAs substrates tilted as 15° toward the [0-1-1] direction, and 0°, 4°, and 6° toward the [0-11] direction, respectively. The change of the surface roughness (morphology) of the InGaP single crystal thin film and the integrated optical intensity according thereto were analyzed.

In addition, the 10K photoluminescence (PL) characteristic of the InGaP single crystal thin films were analyzed. Near band edge (NBE) energy transfer, the change of PL intensity, and the change of integrated optical intensity were measured.

In the experimental example, the growth temperature was 650° C., the V/III ratio was 150, the growth rate was 2 mm/hr, and the InGaP single crystal thin film was evaporated by metal-organic chemical vapor deposition (MOCVD).

Figure 5:
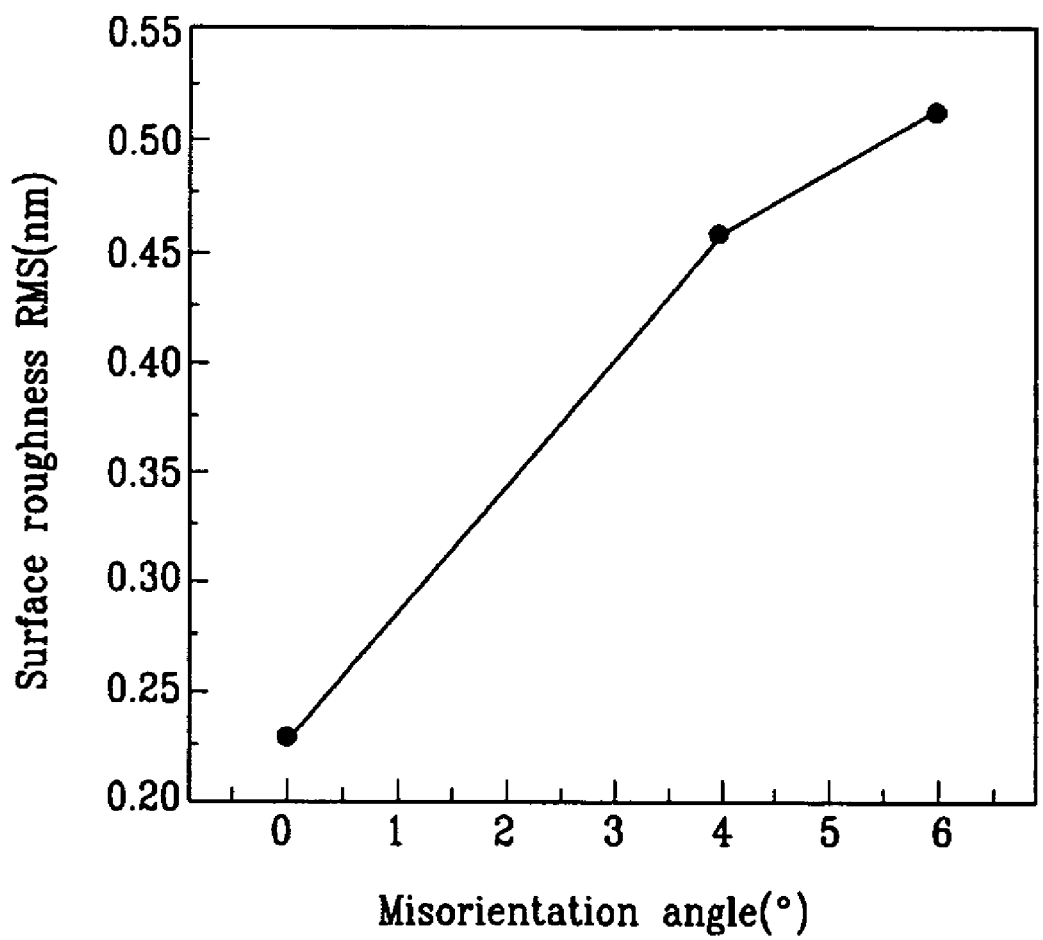
FIG. 5 is a graph showing the change of surface roughness according to the tilted angle in an experimental example.
Figure 6:
FIG. 6 is atomic force microscope (AFM) images showing the surface roughness of the grown single crystal thin films as the (100) GaAs substrate is tilted toward 2nd-direction.
Figure 6:
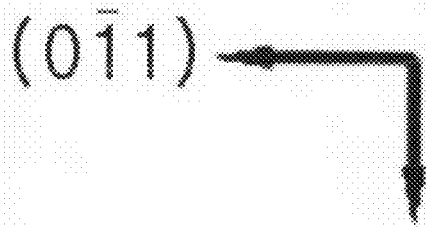
Figure 6:
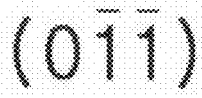
Figure 6:
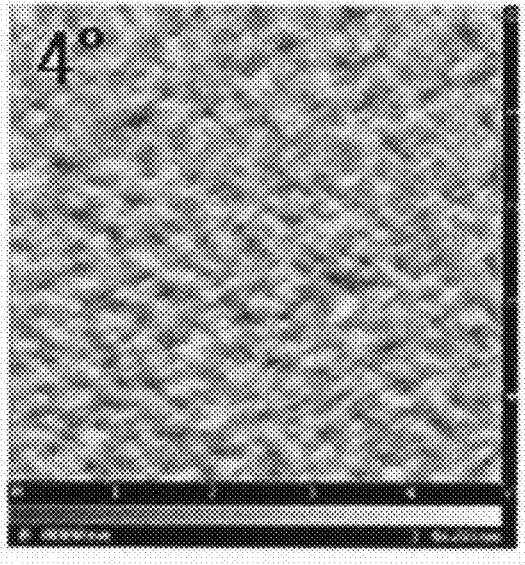
Figure 6:
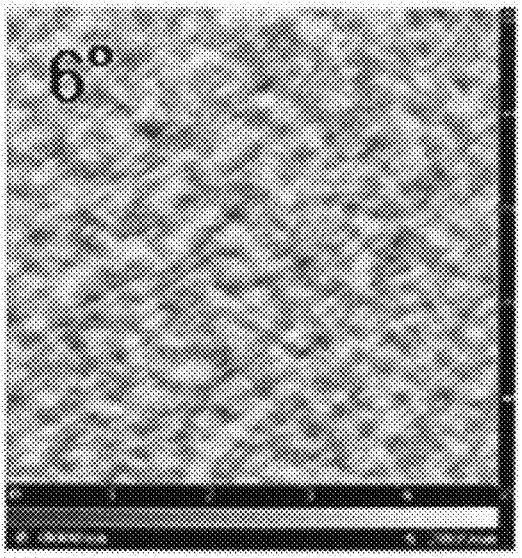

FIG. 5 is a graph showing the change of surface roughness according to the tilted angle in an experimental example, and FIG. 6 is atomic force microscope (AFM) images showing the surface roughness of the grown single crystal thin films as the (100) GaAs substrate is tilted toward 2nd-direction.

As shown in FIG. 5, as the tilting angle was increased, the surface of the single crystal thin film became rougher. This means that the concavo-convexes were generated on the interfaces during the growth of the single crystal thin film. This can be confirmed through the AFM images of FIG. 6.

Figure 7:
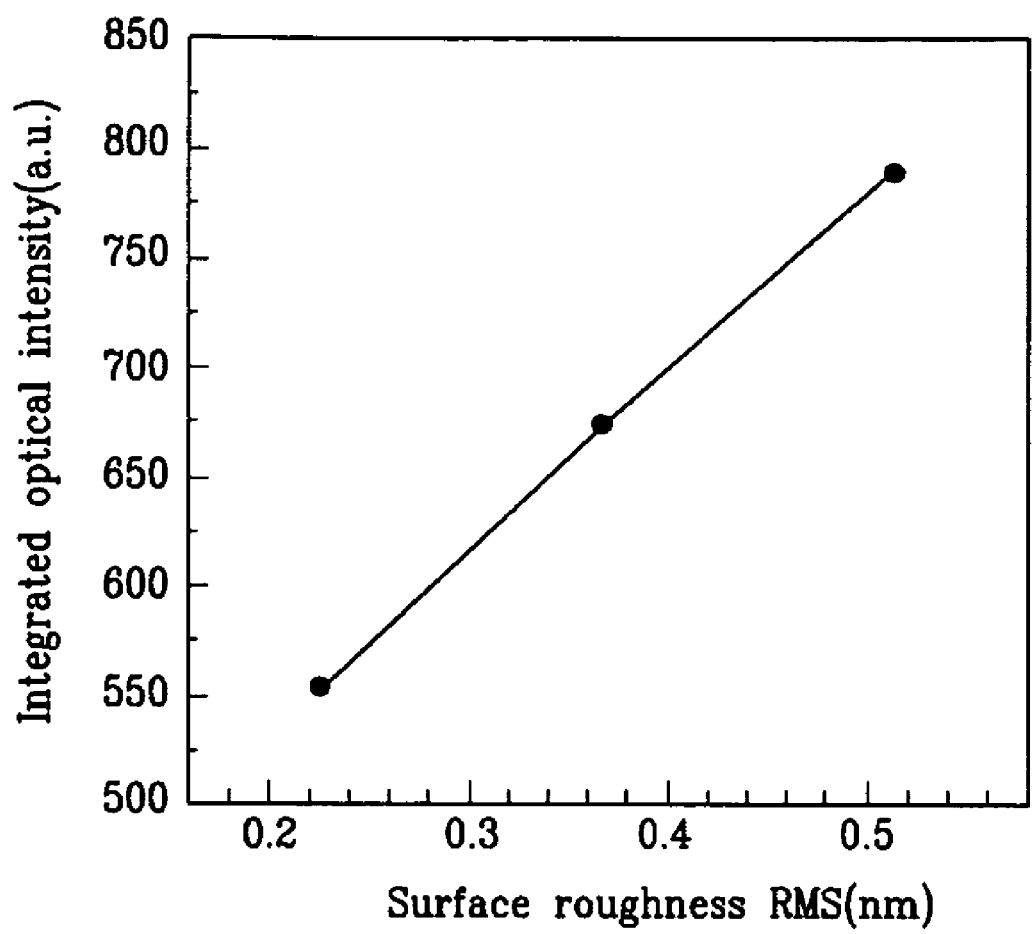
FIG. 7 is a graph showing the change of the integrated optical intensity according to the surface roughness of the single crystal thin films in the experimental example.
Figure 8:
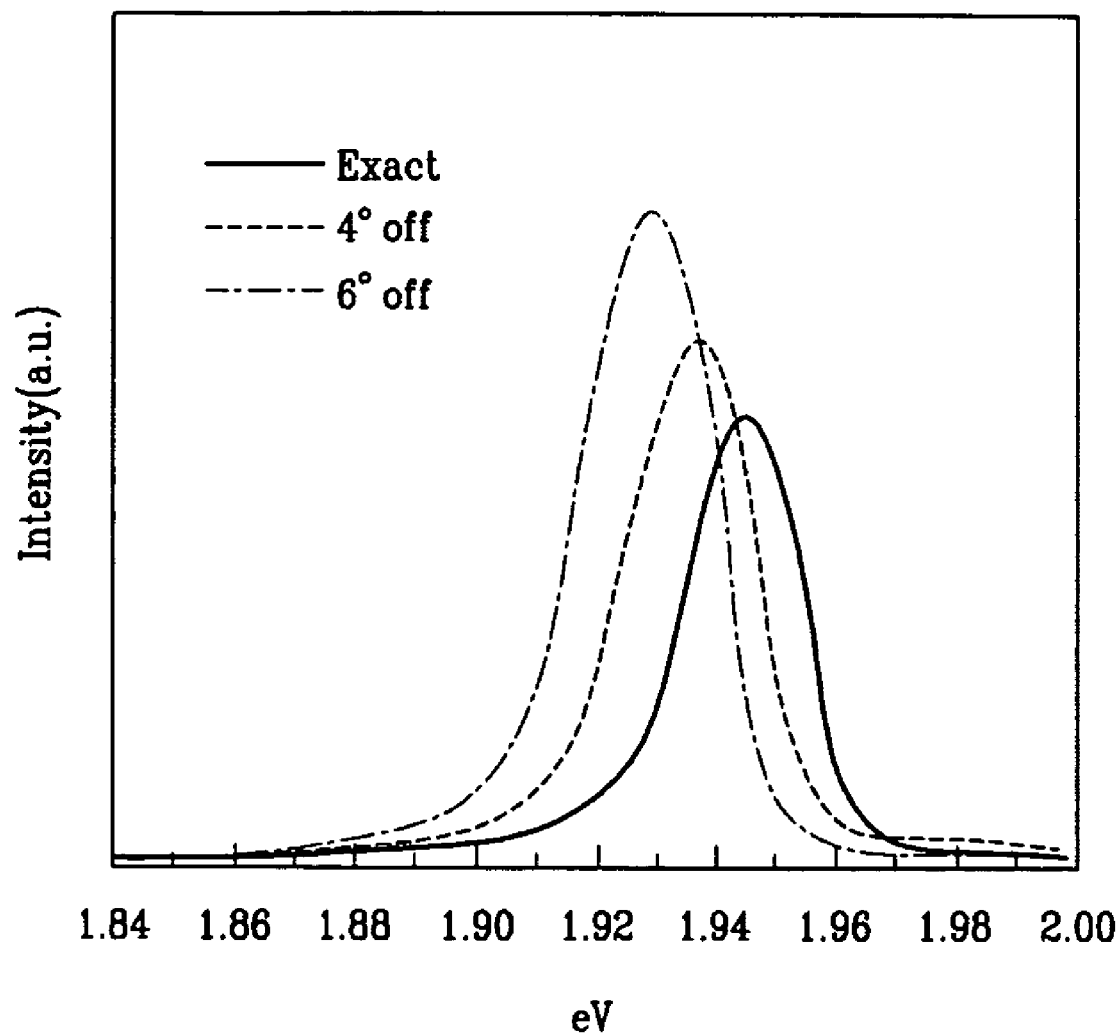
FIG. 8 is a graph showing a spectrum of the photoluminescence (PL) of the single crystal thin films grown on the tilted (100) GaAs substrate.
Figure 9:
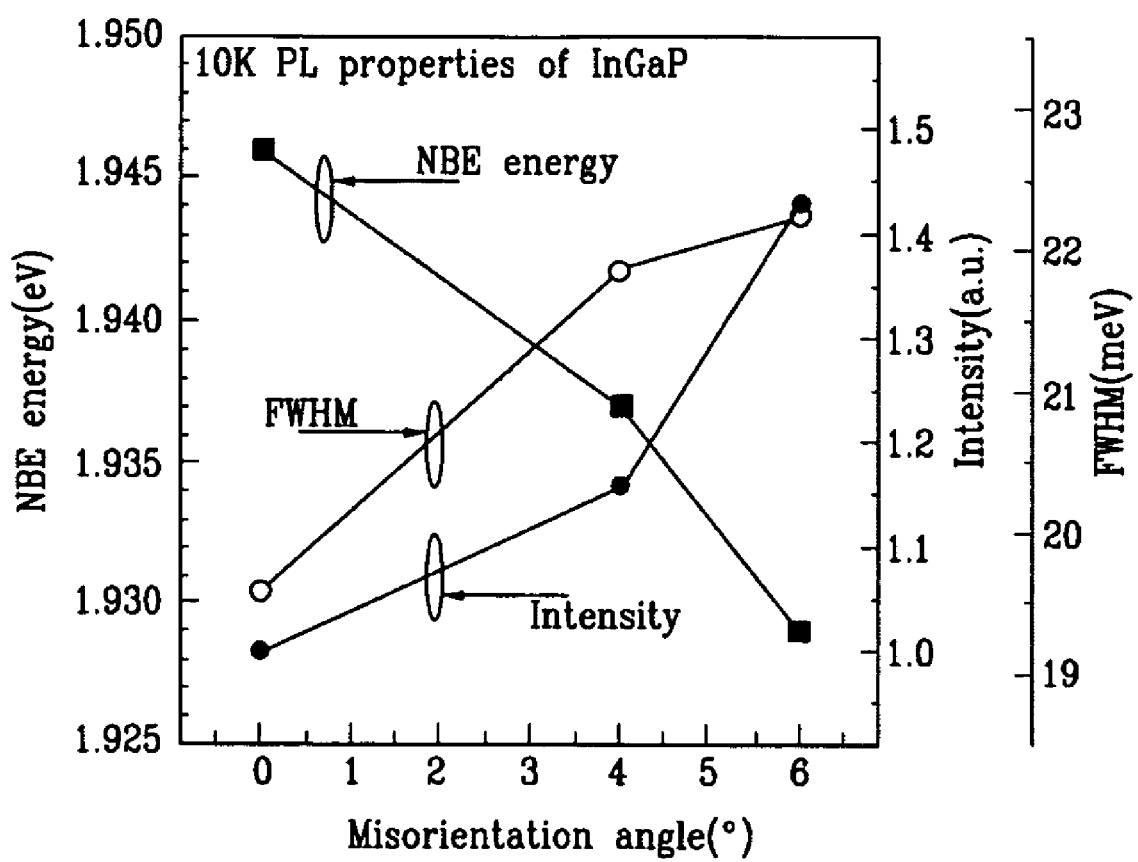
FIG. 9 is a graph showing the shift of PL near band edge (NBE) energy, the change of a full width half maximum (FWHM), and the change of the PL intensity of the single crystal thin films in the experimental example.

FIG. 7 is a graph showing the change of the integrated optical intensity according to the surface roughness of the single crystal thin films in the experimental example, FIG. 8 is a graph showing a spectrum of the photoluminescence (PL) of the single crystal thin films grown on the tilted (100) GaAs substrate, and FIG. 9 is a graph showing the shift of PL near band edge (NBE) energy, the change of a full width half maximum (FWHM), and the change of the PL intensity of the single crystal thin films in the experimental example.

As shown in FIG. 7, as the surface of the single crystal thin film becomes rougher. It means that more concavo-convexes exist on the surface, the integrated optical intensity increases linearly.

In addition, as shown in FIG. 8, as the tilting angle of the substrate toward the [0-11] direction increased from 0° to 4° and 6°, the main peak was red-shifted. And as shown in FIG. 9, NBE of PL transited to low energy.

This means that ordering occurred in the InGaP single crystal thin film. That is, as the direction of the substrate was changed from 0° to 4° and 6°, the ordering occurs remarkably. In addition, the enlargement of the full width half maximum (FWHM) of PL shows that the crystallinity of the single crystal thin film was degraded.

Generally, it is known that the ordering imparts a negative effect on the characteristics of InGaP optical elements, but FIG. 8 and FIG. 9 show that not only the extent of ordering but also the quantity of the light was increased.

This means that although the crystallinity was degraded due to the ordering, the extraction efficiency was improved according to the diffused reflection of the light generated from the InGaP single crystal thin film.

Although preferred embodiments of the present invention have been described in detail hereinabove, it should be clearly understood that many variations and/or modifications of the basic inventive concept herein taught which may appear to those skilled in the art will still fall within the spirit and scope of the present invention, as defined in the appended claims.

As described above, the present invention provides a light emitting diode having improved light emitting efficiency by selectively controlling the crystal orientation of the substrate.

In addition, the present invention provides a fabrication method of the light emitting diode with a relatively low production cost by such a simple process.

What is claimed is:

1. A light emitting diode comprising:
a (100) substrate having a crystal orientation such that a plane of the substrate is inclined toward a first and a second direction simultaneously;
a first cladding layer formed with a semiconductor material of a first conductive type on the (100) substrate;
an active layer formed on the first cladding layer; and
a second cladding layer formed with a semiconductor material of a second conductive type on the active layer,
wherein concavo-convexes are formed on the interfaces of the first cladding layer, the second cladding layer, and the active layer; and
wherein the (100) substrate is a III-V or a IV-IV group semiconductor substrate; and wherein the (100) substrate has a crystal orientation such that a (100) plane of the (100) substrate is inclined 2 to 20° toward the [0-1-1] direction and 1 to 8° toward the [0-11] direction.

2. The light emitting diode of claim 1, wherein the (100) substrate is a GaAs substrate, and the first and second cladding layers are formed with InGaAlP single crystal thin films, and the active layer includes InGaP quantum wells and InGaAlP quantum barriers.

3. The light emitting diode of claim 1, wherein the (100) substrate is an InP substrate, and the first and second cladding layers and the active layer are formed with InGaAsP single crystal thin films.

4. The light emitting diode of claim 1, wherein the (100) substrate is a SiC substrate.

\* \* \* \* \*